US012656686B2

(12) United States Patent
Seko et al.

(10) Patent No.: US 12,656,686 B2
(45) Date of Patent: Jun. 16, 2026

(54) RESIST UNDERLAYER FILM-FORMING COMPOSITION, RESIST UNDERLAYER FILM, AND METHOD OF PRODUCING SEMICONDUCTOR SUBSTRATE

(71) Applicant: JSR CORPORATION, Tokyo (JP)

(72) Inventors: Tomoaki Seko, Tokyo (JP); Yusuke Anno, Tokyo (JP); Akitaka Nii, Tokyo (JP)

(73) Assignee: JSR CORPORATION, Tokyo (JP)

( * ) Notice: Subject to any disclaimer, the term of this patent is extended or adjusted under 35 U.S.C. 154(b) by 786 days.

(21) Appl. No.: 17/950,251

(22) Filed: Sep. 22, 2022

(65) Prior Publication Data

US 2023/0053159 A1 Feb. 16, 2023

Related U.S. Application Data

(63) Continuation of application No. PCT/JP2021/009349, filed on Mar. 9, 2021.

(30) Foreign Application Priority Data

Mar. 27, 2020 (JP) ................................ 2020-058385

(51) Int. Cl.
*G03F 7/11* (2006.01)
*C08G 77/26* (2006.01)
*C09D 183/08* (2006.01)
*H10P 76/20* (2026.01)

(52) U.S. Cl.
CPC ................ *G03F 7/11* (2013.01); *C08G 77/26* (2013.01); *C09D 183/08* (2013.01); *H10P 76/2041* (2026.01)

(58) Field of Classification Search
CPC .......... G03F 7/11; G03F 7/0757; G03F 7/075; C08G 77/26; C09D 183/08
See application file for complete search history.

(56) References Cited

U.S. PATENT DOCUMENTS

| | | | | |
|---|---|---|---|---|
| 9,196,484 | B2 | 11/2015 | Takeda et al. | |
| 10,007,184 | B2 * | 6/2018 | Cui | C09D 5/20 |
| 2013/0183830 | A1 | 7/2013 | Takeda et al. | |
| 2022/0146940 | A1 * | 5/2022 | Kasai | C08G 77/26 |
| 2023/0069221 | A1 * | 3/2023 | Seko | G03F 7/2004 |

FOREIGN PATENT DOCUMENTS

| | | | |
|---|---|---|---|
| CN | 101878451 | A | 11/2010 |
| JP | 2004168748 | A | 6/2004 |
| KR | 10201000992400 | A | 9/2010 |
| WO | WO-2009069712 | A1 | 6/2009 |
| WO | WO-2012039337 | A1 | 3/2012 |
| WO | WO-2014171446 | A1 | 10/2014 |
| WO | WO-2021020091 | A1 | 2/2021 |

OTHER PUBLICATIONS

English Translation of Japanese application Publication 2009-543854 which is the patent application number of the WO 2009/069712 (Year: 2009).*
Office Action issued Dec. 18, 2024, in corresponding Korean Patent Application No. 10-2022-7032936 (with machine English translation), 18 pages.
International Search Report issued Jun. 1, 2021 in PCT/JP2021/009349 (with English translation), 5 pages.
Written Opinion issued Jun. 1, 2021 in PCT/JP2021/009349 (with English translation), 6 pages.
Office Action issued Aug. 20, 2024 in corresponding Japanese Patent Application No. 2022-509542 (with machine English translation), 6 pages.
Combined Taiwanese Office Action and Search Report issued Jul. 23, 2024 in corresponding Taiwanese Patent Application No. 110109890 (with English translation), 11 pages.

* cited by examiner

*Primary Examiner* — Daborah Chacko-Davis
(74) *Attorney, Agent, or Firm* — Element IP, PLC

(57) ABSTRACT

A resist underlayer film-forming composition includes: a polysiloxane compound including a first structural unit represented by formula (1); and a solvent. X represents a group represented by formula (2); a is an integer of 1 to 3; $R^1$ represents a halogen atom, a hydroxy group, or a monovalent organic group having 1 to 20 carbon atoms; and b is an integer of 0 to 2; and a sum of a and b is no greater than 3. $R^2$ represents a monovalent hydrocarbon group having 1 to 20 carbon atoms; n is 1 or 2; $R^3$ represents a hydrogen atom or a monovalent organic group having 1 to 20 carbon atoms; L represents a single bond or a divalent linking group; and * denotes a site bonding to the silicon atom in the formula (1). The composition is suitable for lithography with an electron beam or extreme ultraviolet ray.

(1)

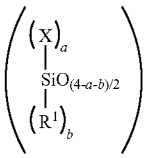

(2)

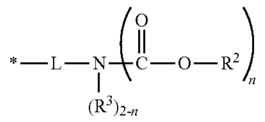

13 Claims, No Drawings

RESIST UNDERLAYER FILM-FORMING COMPOSITION, RESIST UNDERLAYER FILM, AND METHOD OF PRODUCING SEMICONDUCTOR SUBSTRATE

CROSS-REFERENCE TO RELATED APPLICATIONS

The present application is a continuation application of International Application No. PCT/JP2021/009349, filed Mar. 9, 2021, which claims priority to Japanese Patent Application No. 2020-058385 filed Mar. 27, 2020. The contents of these applications are incorporated herein by reference in their entirety.

BACKGROUND OF THE INVENTION

Field of the Invention

The present invention relates to a resist underlayer film-forming composition, a resist underlayer film, and a method of producing a semiconductor substrate.

Discussion of the Background

In pattern formation in production of semiconductor substrates, a multilayer resist process may be employed. The multilayer resist process includes, for example: exposing and developing a resist film laminated via a resist underlayer film such as an organic underlayer film or a silicon-containing film on a substrate; and using as a mask, a resist pattern or the like thus obtained to carry out etching, whereby a substrate is formed having a pattern formed thereon (see PCT International Publication No. 2012/039337).

Recently, enhanced integration of semiconductor devices has progressed further, and in order to form a finer pattern, wavelength of exposure light for use tends to be shortened from a KrF excimer laser (248 nm), an ArF excimer laser (193 nm) or the like, to an extreme ultraviolet ray (EUV, 13.5 nm). In addition, for forming a fine pattern, lithography may be carried out using an electron beam.

SUMMARY OF THE INVENTION

According to an aspect of the present invention, a resist underlayer film-forming composition includes: a polysiloxane compound including a first structural unit represented by formula (1); and a solvent.

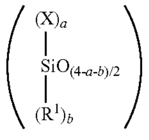

(1)

In the formula (1), X represents a group represented by formula (2); a is an integer of 1 to 3, wherein in a case in which a is no less than 2, a plurality of Xs are identical or different from each other; $R^1$ represents a halogen atom, a hydroxy group, or a monovalent organic group having 1 to 20 carbon atoms; and b is an integer of 0 to 2, wherein in a case in which b is 2, two $R^1$s are identical or different from each other, and wherein a sum of a and b is no greater than 3.

(2)

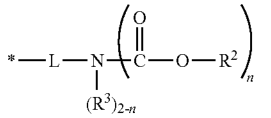

In the formula (2), $R^2$ represents a monovalent hydrocarbon group having 1 to 20 carbon atoms; n is 1 or 2, wherein in a case in which n is 2, a plurality of $R^2$s are identical or different from each other; $R^3$ represents a hydrogen atom or a monovalent organic group having 1 to 20 carbon atoms; L represents a single bond or a divalent linking group; and * denotes a site bonding to the silicon atom in the formula (1). The resist underlayer film-forming composition is suitable for lithography with an electron beam or extreme ultraviolet ray.

According to another aspect of the present invention, a resist underlayer film is formed from the above-described resist underlayer film-forming composition.

According to a further aspect of the present invention, a method of producing a semiconductor substrate includes: applying a resist underlayer film-forming composition directly or indirectly on a substrate to form a coating film; heating the coating film to form a resist underlayer film; applying a resist film-forming composition directly or indirectly on the resist underlayer film to form a resist film; exposing the resist film to an electron beam or extreme ultraviolet ray; and developing the resist film exposed. The resist underlayer film-forming composition includes: a polysiloxane compound including a first structural unit represented by formula (1); and a solvent.

(1)

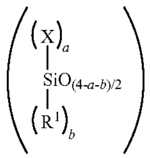

In the formula (1), X represents a group represented by formula (2); a is an integer of 1 to 3, wherein in a case in which a is no less than 2, a plurality of Xs are identical or different from each other; $R^1$ represents a halogen atom, a hydroxy group, or a monovalent organic group having 1 to 20 carbon atoms; and b is an integer of 0 to 2, wherein in a case in which b is 2, two $R^1$s are identical or different from each other, and wherein a sum of a and b is no greater than 3.

(2)

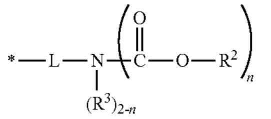

In the formula (2), $R^2$ represents a monovalent hydrocarbon group having 1 to 20 carbon atoms; n is 1 or 2, wherein in a case in which n is 2, a plurality of $R^2$s are identical or different from each other; $R^3$ represents a hydrogen atom or a monovalent organic group having 1 to 20 carbon atoms; L represents a single bond or a divalent linking group; and * denotes a site bonding to the silicon atom in the formula (1).

DESCRIPTION OF EMBODIMENTS

As used herein, the words "a" and "an" and the like carry the meaning of "one or more."When an amount, concentration, or other value or parameter is given as a range, and/or its description includes a list of upper and lower values, this is to be understood as specifically disclosing all integers and fractions within the given range, and all ranges formed from any pair of any upper and lower values, regardless of whether subranges are separately disclosed. Where a range of numerical values is recited herein, unless otherwise stated, the range is intended to include the endpoints thereof, as well as all integers and fractions within the range. As an example, a stated range of 1-10 fully describes and includes the independent subrange 3.4-7.2 as does the following list of values: 1, 4, 6, 10.

In the multilayer resist process, enabling forming, on a silicon-containing film being a resist underlayer film, a resist pattern that is superior in terms of rectangularity of a cross-sectional shape, accompanied by no/fewer defects such as residues is demanded. However, also in conventional lithography with an electron beam or extreme ultraviolet ray, it is difficult to form a fine resist pattern to have a favorable shape. Particularly, as the resist pattern formed becomes finer, pattern collapse is more likely to occur in development and the like. In addition, in a production process of a semiconductor substrate or the like, a resist underlayer film is removed by using a removing liquid. In this procedure, easily removing the resist underlayer film while preventing damage on the substrate is demanded.

One embodiment of the invention is a resist underlayer film-forming composition to be used in lithography with an electron beam or extreme ultraviolet ray, the resist underlayer film-forming composition containing: a polysiloxane compound (hereinafter, may be also referred to as "(A) compound" or "compound (A)") having a first structural unit represented by the following formula (1); and a solvent (hereinafter, may be also referred to as "(B) solvent" or "solvent (B)"), (1)

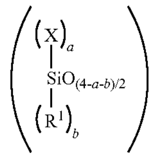

wherein, in the formula (1), X represents a group represented by the following formula (2); a is an integer of 1 to 3, wherein in a case in which a is no less than 2, a plurality of Xs are identical or different from each other; $R^1$ represents a halogen atom, a hydroxy group, or a monovalent organic group having 1 to 20 carbon atoms; and b is an integer of 0 to 2, wherein in a case in which b is 2, two $R^1$s are identical or different from each other, and wherein a sum of a and b is no greater than 3, and (2)

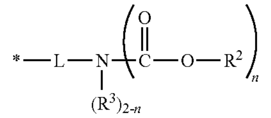

in the formula (2), $R^2$ represents a monovalent hydrocarbon group having 1 to 20 carbon atoms; n is 1 or 2, wherein in a case in which n is 2, a plurality of $R^2$s are identical or different from each other; $R^3$ represents a hydrogen atom or a monovalent organic group having 1 to 20 carbon atoms; L represents a single bond or a divalent linking group; and * denotes a site bonding to the silicon atom in the above formula (1).

An other embodiment of the invention is a resist underlayer film to be used in lithography with an electron beam or extreme ultraviolet ray, the resist underlayer film being formed from the resist underlayer film-forming composition to be used in lithography with an electron beam or extreme ultraviolet ray according to the one embodiment of the invention.

Still another embodiment of the invention is a method of producing a semiconductor substrate, the method including: applying a resist underlayer film-forming composition directly or indirectly on a substrate; heating a coating film formed by the applying of the resist underlayer film-forming composition; applying a resist film-forming composition directly or indirectly on a resist underlayer film formed by the heating; exposing to an electron beam or extreme ultraviolet ray a resist film formed by the applying of the resist film-forming composition; and developing the resist film exposed, wherein the resist underlayer film-forming composition is the resist underlayer film-forming composition to be used in lithography with an electron beam or extreme ultraviolet ray according to the one embodiment of the invention.

According to the embodiments of the present invention, providing: a composition which is to be used in forming a resist underlayer film in lithography with an electron beam or an extreme ultraviolet ray, and which is capable of forming a resist underlayer film that enables forming a fine resist pattern on the resist underlayer film to be formed and that can be easily removed; a resist underlayer film formed from such a composition; and a method of producing a semiconductor substrate in which such a composition is used is enabled.

The resist underlayer film-forming composition to be used in lithography with an electron beam or extreme ultraviolet ray (hereinafter, may be also referred to as "resist underlayer film-forming composition"), the resist underlayer film to be used in lithography with an electron beam or extreme ultraviolet ray (hereinafter, may be also referred to as "resist underlayer film"), and the method of producing a semiconductor substrate of the embodiments of the present invention will be described in detail below.

Resist Underlayer Film-Forming Composition

The resist underlayer film-forming composition of one embodiment of the present invention contains the compound (A) and the solvent (B). The resist underlayer film-forming composition may also contain other optional component(s) (hereinafter, may be merely referred to as "optional component(s)"), within a range not leading to impairment of the effects of the present invention.

Due to containing the compound (A) and solvent (B), the resist underlayer film-forming composition enables forming a fine resist pattern on the resist underlayer film to be formed in lithography with an electron beam or extreme ultraviolet ray. Furthermore, the resist underlayer film (silicon-containing film) formed from the resist underlayer film-forming composition is superior in terms of removability (film removability) with a removing liquid containing an acid. Although not necessarily clarified and without wishing to be bound by any theory, the reason for achieving the aforementioned effects by the resist underlayer film-forming composition may be presumed, for example, as in the following, for example. In forming the resist underlayer film, typically, heating of the coating film of the resist underlayer film-forming composition is carried out for removing the solvent and hardening the coating film. During this heating, detachment of a protecting group ($R^2$) and decarboxylation ($CO_2$), i.e., detachment of the group represented by —$COOR^2$ occurs in the group represented by the above formula (2) included in the compound (A), and as a result, primary or secondary amino groups are generated. When these amino groups, being basic, are present on a surface of the resist underlayer film, it is considered that rectangularity of a cross-sectional shape becomes superior even in a case of a fine resist pattern by lithography with an electron beam or extreme ultraviolet ray, since the acid in the resist film being in contact with the surface of the resist underlayer film can be captured. Specifically, for example, in a case of a positive-tone resist pattern provided using an alkaline developer solution, the acid in the resist film is captured on a surface of the resist underlayer film at regions unexposed with light, whereby a cross-sectional shape of a bottom of the resist pattern is less likely to be gouged and collapse of the resist pattern is inhibited. Alternatively, in a case of a negative-tone resist pattern provided using an organic solvent development liquid, the acid in the resist film is captured on a surface of the resist underlayer film at regions unexposed with light, whereby it is considered that residues are less likely to be left after the development, and forming a resist pattern superior in rectangularity of the cross-sectional shape is enabled. Accordingly, it is speculated that by using the resist underlayer film-forming composition, a fine resist pattern can be formed on the resist underlayer film. In addition, it is considered that solubility in the removing liquid containing an acid is improved and thus film removability can be improved since amino groups are present in the resist underlayer film formed.

Each component contained in the resist underlayer film-forming composition is described below.

(A) Compound

The compound (A) is a polysiloxane compound having a first structural unit represented by the following formula (1) (hereinafter, may be also referred to as "structural unit (I)"), described later. The "polysiloxane compound" as referred to herein means a compound including a siloxane bond (—Si—O—Si—). The compound (A) may also have, within a range not leading to impairment of the effects of the present invention, other structural unit(s) aside from the structural unit (I).

Each structural unit included in the compound (A) is described below.

Structural Unit (I)

The structural unit (I) is a structural unit represented by the following formula (1). The compound (A) may have one, or two or more types of the structural unit (I).

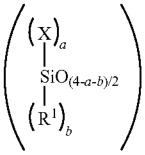

(1)

In the formula (1), X represents a group represented by the following formula (2); a is an integer of 1 to 3, wherein in a case in which a is no less than 2, a plurality of Xs are identical or different from each other; $R^1$ represents a halogen atom, a hydroxy group, or a monovalent organic group having 1 to 20 carbon atoms; and b is an integer of 0 to 2, wherein in a case in which b is 2, two $R^1$s are identical or different from each other, and wherein a sum of a and b is no greater than 3.

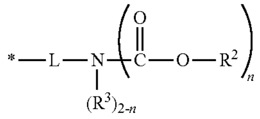

(2)

In the formula (2), $R^2$ represents a monovalent hydrocarbon group having 1 to 20 carbon atoms; n is 1 or 2, wherein in a case in which n is 2, a plurality of $R^2$s are identical or different from each other; $R^3$ represents a hydrogen atom or a monovalent organic group having 1 to 20 carbon atoms; L represents a single bond or a divalent linking group; and * denotes a site bonding to the silicon atom in the above formula (1).

As referred to herein, the "organic group" means a group having at least one carbon atom, and the number of "carbon atoms" means the number of carbon atom(s) constituting a group.

The monovalent organic group having 1 to 20 carbon atoms which may be represented by $R^1$ is exemplified by: a monovalent hydrocarbon group having 1 to 20 carbon atoms; a group (hereinafter, may be also referred to as "group (α)") that contains a divalent heteroatom-containing group between two adjacent carbon atoms of the monovalent hydrocarbon group; a group (hereinafter, may be also referred to as "group (β)") obtained by substituting with a monovalent heteroatom-containing group, a part or all of hydrogen atoms included in the monovalent hydrocarbon group or the group (a); a group (hereinafter, may be also referred to as "group (γ)") obtained by combining the monovalent hydrocarbon group, the group (α), or the group (β) with a divalent heteroatom-containing group; and the like. It is to be noted that the group represented by the above formula (2) is excluded from the monovalent organic group having 1 to 20 carbon atoms which may be represented by $R^1$.

As referred to herein, the "hydrocarbon group" may be exemplified by a chain hydrocarbon group, an alicyclic hydrocarbon group, and an aromatic hydrocarbon group. The "hydrocarbon group" may be either a saturated hydrocarbon group or an unsaturated hydrocarbon group. The "chain hydrocarbon group" as referred to herein means a hydrocarbon group not including a ring structure but being constituted with only a chain structure, and may be exemplified by both a linear hydrocarbon group and a branched hydrocarbon group. The "alicyclic hydrocarbon group" as referred to herein means a hydrocarbon group including, as a ring structure, not an aromatic ring structure but an alicyclic structure alone, and may be exemplified by both a monocyclic alicyclic hydrocarbon group and a polycyclic alicyclic hydrocarbon group. With regard to this, it is not necessary for the alicyclic hydrocarbon group to be constituted with only an alicyclic structure; and it may include a chain structure in a part thereof. The “aromatic hydrocarbon group” as referred to herein means a hydrocarbon group including an aromatic ring structure as a ring structure. With regard to this, it is not necessary for the aromatic hydrocarbon group to be constituted with only an aromatic ring structure; it may include a chain structure or an alicyclic structure in a part thereof.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, and a monovalent aromatic hydrocarbon group having 6 to 20 carbon atoms.

Examples of the monovalent chain hydrocarbon group having 1 to 20 carbon atoms include: alkyl groups such as a methyl group, an ethyl group, an n-propyl group, an i-propyl group, an n-butyl group, a sec-butyl group, an iso-butyl group, and a tert-butyl group; alkenyl groups such as an ethenyl group, a propenyl group, and a butenyl group; alkynyl groups such as an ethynyl group, a propynyl group, and a butynyl group; and the like.

Examples of the monovalent alicyclic hydrocarbon group having 3 to 20 carbon atoms include: monocyclic alicyclic saturated hydrocarbon groups such as a cyclopentyl group and a cyclohexyl group; polycyclic alicyclic saturated hydrocarbon groups such as a norbornyl group, an adamantyl group, a tricyclodecyl group, and a tetracyclododecyl group; monocyclic alicyclic unsaturated hydrocarbon groups such as a cyclopentenyl group and a cyclohexenyl group; polycyclic alicyclic unsaturated hydrocarbon groups such as a norbornenyl group, a tricyclodecenyl group, and a tetracyclododecenyl group; and the like.

Examples of the monovalent aromatic hydrocarbon group having 6 to 20 carbon atoms include: aryl groups such as a phenyl group, a tolyl group, a xylyl group, a naphthyl group, and an anthryl group; aralkyl groups such as a benzyl group, a phenethyl group, a naphthylmethyl group, and an anthrylmethyl group; and the like.

Exemplary heteroatoms which may constitute the divalent or monovalent heteroatom-containing group include an oxygen atom, a nitrogen atom, a sulfur atom, a phosphorus atom, a silicon atom, a halogen atom, and the like. Examples of the halogen atom include a fluorine atom, a chlorine atom, a bromine atom, and an iodine atom.

Examples of the divalent heteroatom-containing group include —O—, —C(═O)—, —S—, —C(═S)—, —NR'—, groups obtained by combination of at least two of these, and the like, wherein R' represents a hydrogen atom or a monovalent hydrocarbon group.

The monovalent heteroatom-containing group is exemplified by a halogen atom, a hydroxy group, a carboxy group, a cyano group, an amino group, a sulfanyl group, and the like.

Examples of the halogen atom which may be represented by $R^1$ include a fluorine atom, a chlorine atom, a bromine atom, and an iodine atom.

$R^1$ represents preferably the monovalent organic group having 1 to 20 carbon atoms, more preferably the monovalent chain hydrocarbon group, the monovalent aromatic hydrocarbon group, or the monovalent group obtained by substituting, with the monovalent heteroatom-containing group, a part or all of hydrogen atoms included in the monovalent hydrocarbon group, still more preferably the alkyl group or the aryl group, and even more preferably a methyl group, an ethyl group, or a phenyl group.

Examples of the monovalent hydrocarbon group having 1 to 20 carbon atoms represented by $R^2$ include groups similar to the groups exemplified above as the monovalent organic group having 1 to 20 carbon atoms which may be represented by $R^1$, and the like.

$R^2$ represents preferably the monovalent chain hydrocarbon group having 1 to 20 carbon atoms or the monovalent aromatic hydrocarbon group having 6 to 20 carbon atoms, and more preferably the monovalent chain hydrocarbon group having 1 to 20 carbon atoms.

In the case in which $R^2$ represents the monovalent chain hydrocarbon group having 1 to 20 carbon atoms, it is preferred that the chain hydrocarbon group bonds to the oxygen atom at a tertiary carbon atom. In other words, the chain hydrocarbon group is preferably a tertiary chain hydrocarbon group. Furthermore, the chain hydrocarbon group is preferably the alkyl group. More specifically, in the case in which $R^2$ represents the monovalent chain hydrocarbon group having 1 to 20 carbon atoms, the chain hydrocarbon group is more preferably a tertiary alkyl group, still more preferably a tertiary alkyl group having 4 to 8 carbon atoms, even more preferably a tertiary alkyl group having 4 to 6 carbon atoms, and particularly preferably a t-butyl group. Moreover, it is preferred that $R^2$ bonds to the oxygen atom at a tertiary carbon atom, irrespective of the type of the hydrocarbon group, i.e., that $R^2$ represents a tertiary hydrocarbon group.

In the case in which $R^2$ represents such a tertiary hydrocarbon group, detachment of $R^2$, etc., accompanied by heating efficiently occurs, whereby the amino groups become more likely to be present on the surface of the resist underlayer film, leading to improvements of: rectangularity of the resist pattern to be formed on the resist underlayer film; a resist pattern collapse-inhibiting property; removability of the resist underlayer film; and the like.

Examples of the monovalent organic group having 1 to 20 carbon atoms which may be represented by $R^3$ include groups similar to the groups exemplified above as the monovalent organic group having 1 to 20 carbon atoms which may be represented by $R^1$, and the like. It is to be noted that the group represented by —COO—$R^2$ is excluded from the monovalent organic group having 1 to 20 carbon atoms which may be represented by $R^3$.

$R^3$ represents preferably the monovalent organic group having 1 to 20 carbon atoms, more preferably the monovalent hydrocarbon group having 1 to 20 carbon atoms, still more preferably the chain hydrocarbon group or the alicyclic hydrocarbon group, even more preferably the chain hydrocarbon group, and yet more preferably the alkyl group. The number of carbon atoms of the group represented by $R^3$ is preferably 1 to 8, and more preferably 1 to 4.

In the case in which $R^3$ represents such a group, due to, e.g., increased basicity of the groups (amino groups) generated while heating, effects achieved by the resist underlayer film-forming composition such as the rectangularity of the resist pattern to be formed on the resist underlayer film, the resist pattern collapse-inhibiting property, and the removability of the resist underlayer film are further enhanced. Furthermore, in the case in which $R^3$ represents the hydrocarbon group, due to, e.g., increased hydrophobicity of the resist underlayer film, adhesiveness between the resist underlayer film and the resist pattern is enhanced, whereby in particular, occurrence of collapse, etc., of the resist pattern in the development with an alkali is inhibited.

The divalent linking group which may be represented by L is exemplified by a divalent organic group having 1 to 20 carbon atoms, and the like. Examples of the divalent organic group having 1 to 20 carbon atoms include groups obtained by removing one hydrogen atom from the monovalent organic group exemplified above as the monovalent organic group having 1 to 20 carbon atoms which may be represented by $R^1$, and the like.

L represents preferably a divalent hydrocarbon group having 1 to 20 carbon atoms, more preferably a divalent chain hydrocarbon group having 1 to 20 carbon atoms, and still more preferably an alkanediyl group having 1 to 20 carbon atoms. The number of carbon atoms of the group represented by L is preferably 1 to 12, and more preferably 1 to 6. A preferred mode of the group represented by L may be exemplified by a group represented by $-(CH_2)_m-$ (wherein, m is an integer of 1 to 6).

a is preferably 1 or 2, and more preferably 1.

b is preferably 0 or 1, and more preferably 0.

n is preferably 1. In the case in which n is 1 and $R^3$ represents the organic group, the amino groups generated while heating become secondary amino groups. In general, the secondary amino groups have higher basicity than the primary amino groups. Due to generation of the amino groups having such high basicity, the rectangularity of the resist pattern to be formed on the resist underlayer film, the resist pattern collapse-inhibiting property, the removability of the resist underlayer film, and the like are improved. Furthermore, in general, since the secondary amino groups have higher hydrophobicity than the primary amino groups, adhesiveness between the resist underlayer film and the resist pattern is increased, whereby in particular, occurrence of collapse, etc., of the resist pattern in the development with an alkali is inhibited.

Examples of the structural unit (I) include structural units derived from compounds represented by the following formulae (1-1) to (1-19), and the like.

(1-1)

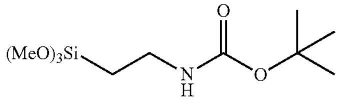

(1-2)

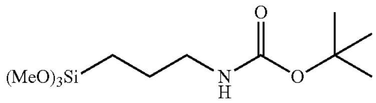

(1-3)

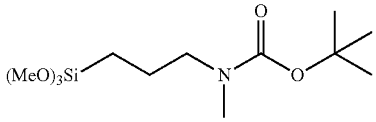

(1-4)

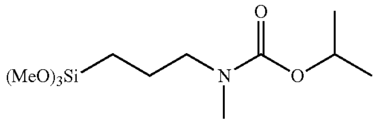

(1-5)

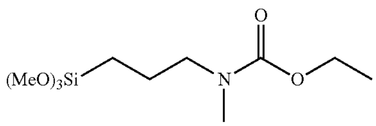

-continued (1-6)

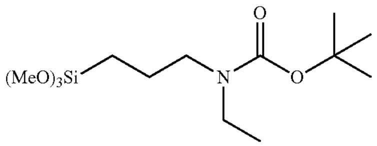

(1-7)

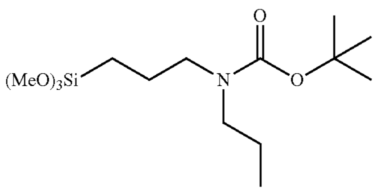

(1-8)

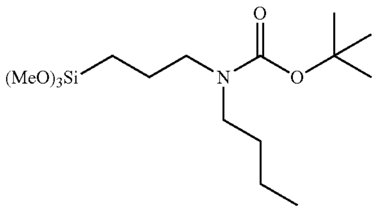

(1-9)

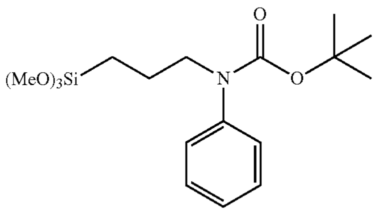

(1-10)

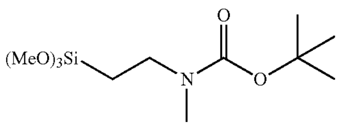

(1-11)

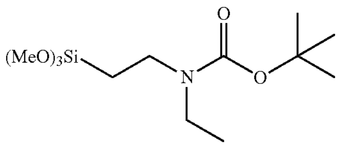

(1-12)

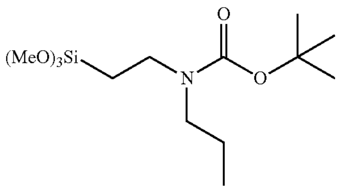

(1-13)

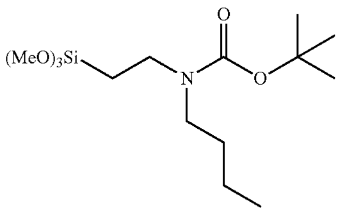

-continued (1-14)

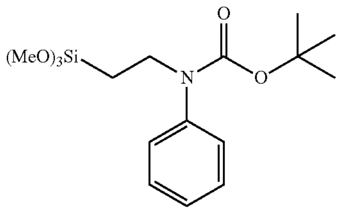

(1-15)

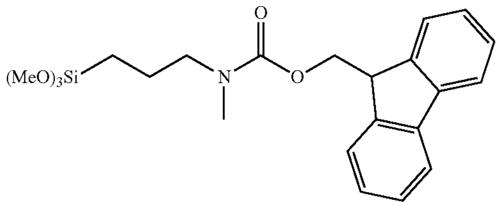

(1-16)

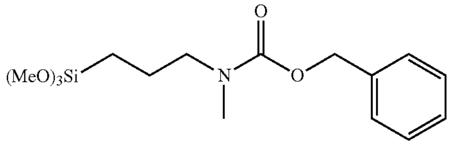

(1-17)

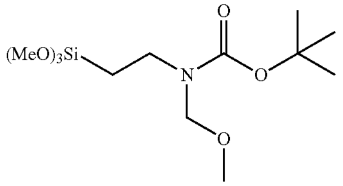

(1-18)

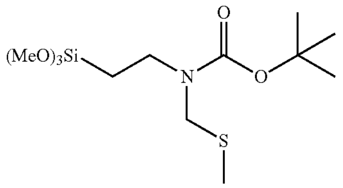

(1-19)

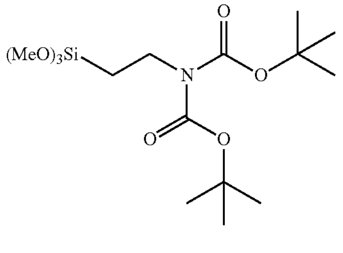

The lower limit of a proportion of the structural unit (I) contained in the compound (A) is, with respect to the total structural units constituting the compound (A), preferably 0.1 mol %, more preferably 1 mol %, still more preferably 2 mol %, and even more preferably 3 mol %. Further, the upper limit of the proportion of the structural unit (I) is preferably 80 mol %, more preferably 50 mol %, and still more preferably 20 mol %. When the proportion of the structural unit (I) falls within the above range, in forming the resist pattern on the resist underlayer film by lithography with an electron beam or extreme ultraviolet ray, a fine resist pattern with more superior rectangularity of the cross-sectional shape and with less likelihood of collapse can be formed, and film removability is also enhanced.

Other Structural Unit

Examples of the other structural unit include a second structural unit (hereinafter, may be also referred to as "structural unit (II)") represented by the following formula (3), a third structural unit (hereinafter, may be also referred to as "structural unit (III)") represented by the following formula (4), and the like. In the case in which the compound (A) has the structural unit (II), storage stability and coating characteristics of the resist underlayer film-forming composition can be improved. Moreover, in the case in which the compound (A) has the structural unit (III), resistance to etching with oxygen gas of the resist underlayer film formed from the resist underlayer film-forming composition, and the like, can be improved.

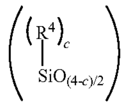

(3)

In the above formula (3), $R^4$ represents a halogen atom, a hydroxy group, or a monovalent organic group having 1 to 20 carbon atoms; and c is an integer of 1 to 3, wherein in a case in which c is no less than 2, a plurality of $R^4$s are identical or different from each other.

Examples of the monovalent organic group having 1 to 20 carbon atoms which may be represented by $R^4$ include groups similar to the groups exemplified above as the monovalent organic group having 1 to 20 carbon atoms groups which may be represented by $R^1$, and the like.

Examples of the halogen atom which may be represented by $R^4$ include a fluorine atom, a chlorine atom, a bromine atom, and an iodine atom.

$R^4$ represents preferably the hydrocarbon group, and more preferably the alkyl group or the aryl group. The number of carbon atoms of the group which may be represented by $R^4$ is preferably 1 to 12, and more preferably 1 to 8.

c is preferably 1.

In the case in which the compound (A) has the structural unit (II) as the other structural unit, the lower limit of a proportion of the structural unit (II) with respect to the total structural units constituting the compound (A) is preferably 0.1 mol %, more preferably 1 mol %, and may be still more preferably 2 mol %, 3 mol %, or 5 mol %. The upper limit of the proportion is preferably 40 mol %, more preferably 30 mol %, and still more preferably 20 mol %.

$$(SiO_{4/2}) \quad (4)$$

In the case in which the compound (A) has the structural unit (III) as the other structural unit, the lower limit of a proportion of the structural unit (III) with respect to the total structural units constituting the compound (A) is preferably 30 mol %, more preferably 40 mol %, and may be still more preferably 50 mol %, 60 mol %, or 70 mol %. The upper limit of the proportion is preferably 95 mol %, more preferably 90 mol %, and still more preferably 85 mol %.

The lower limit of a total proportion of the structural unit (I), the structural unit (II), and the structural unit (III) with respect to the total structural units constituting the compound (A) is preferably 80 mol %, more preferably 90 mol %, and may be still more preferably 95 mol % or 99 mol %. The upper limit of the total proportion may be 100 mol %.

The lower limit of a proportion of the compound (A) contained in the resist underlayer film-forming composition with respect to total components contained in the resist underlayer film-forming composition is preferably 0.1% by mass, more preferably 0.3% by mass, and still more preferably 0.5% by mass. The upper limit of the proportion is preferably 10% by mass, more preferably 5% by mass, still more preferably 3% by mass, and even more preferably 2% by mass.

The lower limit of a proportion of the compound (A) in the total solid content of the resist underlayer film-forming composition is preferably 50% by mass, more preferably 70% by mass, and may be still more preferably 80% by mass, 90% by mass, or and 95% by mass. The upper limit of the proportion is preferably 100% by mass, and may be 99% by mass or 95% by mass. It is to be noted that the total solid content as referred to herein means total components other than the solvent (B) and water (D).

The compound (A) preferably has a form of a polymer. A "polymer" as referred to herein means a compound having no less than two structural units; in a case in which an identical structural unit repeats twice or more, this structural unit may be also referred to as a "repeating unit." In the case in which the compound (A) has the form of a polymer, the lower limit of a polystyrene equivalent weight average molecular weight (Mw) of the compound (A) as determined by gel permeation chromatography (GPC) is preferably 1,000, more preferably 1,200, and still more preferably 1,500. The upper limit of the Mw is preferably 10,000, more preferably 5,000, and still more preferably 3,000.

It is to be noted that as referred to herein, the Mw of the compound (A) is a value measured by gel permeation chromatography (GPC) using GPC columns available from Tosoh Corporation ("G2000 HXL"×2, "G3000 HXL"×1, and "G4000 HXL"×1) under the following conditions.

elution solvent: tetrahydrofuran
flow rate: 1.0 mL/min
sample concentration: 1.0% by mass
amount of injected sample: 100 uL
column temperature: 40° C.
detector: differential refractometer
standard substance: mono-dispersed polystyrene The compound (A) can be synthesized by using a monomer that gives each structural unit according to a common procedure. For example, the compound (A) can be obtained by: carrying out hydrolytic condensation with a monomer that gives the structural unit (I) and, as necessary, monomer(s) that give(s) the other structural unit(s), in a solvent in the presence of water and a catalyst such as oxalic acid. It is believed that by the hydrolytic condensation reaction or the like, respective monomers are incorporated into the compound (A) regardless of a type thereof. Thus, proportions of the structural unit (I) and the other structural unit(s) in the thus synthesized compound (A) will typically be equivalent to proportions of the charge amounts of respective monomers used in the synthesis reaction.

(B) Solvent

The solvent (B) is not particularly limited and is exemplified by an alcohol solvent, a ketone solvent, an ether solvent, an ester solvent, a nitrogen-containing solvent, and the like. The solvent (B) is typically an organic solvent. The resist underlayer film-forming composition may contain one, or two or more types of the solvent (B).

Examples of the alcohol solvent include: monohydric alcohol solvents such as methanol, ethanol, n-propanol, iso-propanol, n-butanol, and iso-butanol; polyhydric alcohol solvents such as ethylene glycol, 1,2-propylene glycol, diethylene glycol, and dipropylene glycol; and the like.

Examples of the ketone solvent include acetone, methyl ethyl ketone, methyl n-propyl ketone, methyl iso-butyl ketone, cyclohexanone, and the like.

Examples of the ether solvent include ethyl ether, isopropyl ether, ethylene glycol dibutyl ether, diethylene glycol monomethyl ether, diethylene glycol monoethyl ether, diethylene glycol diethyl ether, propylene glycol monomethyl ether, propylene glycol monoethyl ether, propylene glycol monopropyl ether, tetrahydrofuran, and the like.

Examples of the ester solvent include ethyl acetate, γ-butyrolactone, n-butyl acetate, ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, dipropylene glycol monomethyl ether acetate, dipropylene glycol monoethyl ether acetate, ethyl propionate, n-butyl propionate, methyl lactate, ethyl lactate, and the like.

Examples of the nitrogen-containing solvent include N,N-dimethylformamide, N,N-dimethylacetamide, N-methylpyrrolidone, and the like.

Of these, the ether solvent or the ester solvent is preferred, and due to superiority in film formability, the ether solvent having a glycol structure or the ester solvent having a glycol structure is more preferred.

Examples of the ether solvent having a glycol structure and the ester solvent having a glycol structure include propylene glycol monomethyl ether, propylene glycol monoethyl ether, propylene glycol monopropyl ether, propylene glycol monomethyl ether acetate, propylene glycol monoethyl ether acetate, propylene glycol monopropyl ether acetate, and the like. Of these, propylene glycol monomethyl ether acetate and propylene glycol monoethyl ether are preferred.

The lower limit of a proportion of the solvent (B) contained in the resist underlayer film-forming composition with respect to the total components contained in the resist underlayer film-forming composition is preferably 90% by mass, more preferably 92.5% by mass, and still more preferably 95% by mass. The upper limit of the proportion is preferably 99.9% by mass, more preferably 99.5% by mass, and still more preferably 99% by mass.

Optional Component(s)

The optional component(s) is/are exemplified by an acid generating agent, a basic compound (including a base generating agent), a radical generating agent, a surfactant, colloidal silica, colloidal alumina, an organic polymer, water, and the like. The resist underlayer film-forming composition may contain one, or two or more types of the optional component.

In the case in which the resist underlayer film-forming composition contains the optional component(s), the proportion of the optional component(s) contained in the resist underlayer film-forming composition may be appropriately determined in accordance with the type of the optional component(s) used, and to fall within a range not leading to impairment of the effects of the present invention.

(C) Acid Generating Agent

In a case in which the resist underlayer film-forming composition contains the acid generating agent (C), improving a hardening property of the resist underlayer film-forming composition, inhibiting intermixing of the resist underlayer film with the resist film, and the like may be enabled.

The acid generating agent (C) is a component that generates an acid upon exposure or heating. Due to the acid generating agent being contained in the film-forming composition, a hardening reaction of the compound (A) can be promoted even at a comparatively low temperature (including a normal temperature).

The acid generating agent that generates an acid upon an exposure is exemplified by acid generating agents disclosed in paragraphs [0077] to [0081] of Japanese Unexamined Patent Application, Publication No. 2004-168748, and the like.

Furthermore, examples of the acid generating agent that generates an acid upon heating include 2,4,4,6-tetrabromocyclohexadienone, benzoin tosylate, 2-nitrobenzyl tosylate, alkyl sulfonates, onium salt-type acid generating agents exemplified as photo acid generating agents in Japanese Unexamined Patent Application, Publication No. 2004-168748 described above, and the like.

In the case in which the resist underlayer film-forming composition contains the acid generating agent (C), the lower limit of a proportion of the acid generating agent (C) contained in the resist underlayer film-forming composition with respect to the total components contained in the resist underlayer film-forming composition is, for example, preferably 0.001% by mass, and more preferably 0.01% by mass. The upper limit of the proportion is preferably 1% by mass, more preferably 0.5% by mass, and still more preferably 0.1% by mass. When the proportion of the acid generating agent (C) is no less than the lower limit, the hardening property can be more improved. When the proportion of the acid generating agent (C) is no greater than the upper limit, basicity of the surface of the resist underlayer film formed is more likely to be maintained, and the rectangularity of the resist pattern to be formed on the resist underlayer film, the resist pattern collapse-inhibiting property, the removability of the resist underlayer film, and the like are improved.

(D) Water

When the resist underlayer film-forming composition contains water (D), storage stability is improved due to the compound (A) being hydrated. In addition, when water (D) is contained, hardening in the forming of the resist underlayer film is promoted, and a compact resist underlayer film can be obtained. It is to be noted that water (D) is excluded from the solvent (B).

In the case in which the resist underlayer film-forming composition contains water (D), the lower limit of a proportion of water (D) contained in the resist underlayer film-forming composition with respect to the total components contained in the resist underlayer film-forming composition is, for example, preferably 0.1% by mass, and more preferably 0.2% by mass. The upper limit of the proportion is preferably 20% by mass, and more preferably 5% by mass.

Preparation Procedure of Resist Underlayer Film-Forming Composition

A procedure of preparing the resist underlayer film-forming composition is not particularly limited, and the resist underlayer film-forming composition may be prepared according to a common procedure. The resist underlayer film-forming composition may be prepared by, for example: mixing at a predetermined ratio, a solution of the compound (A), the solvent (B), and as needed, the optional component (s); and preferably filtering a resulting mixture through a filter, etc. having a pore size of no greater than 0.2 μm.

Resist Underlayer Film

The resist underlayer film of the other embodiment of the present invention is a resist underlayer film to be used in lithography with an electron beam or extreme ultraviolet ray, and is formed from the resist underlayer film-forming composition of the one embodiment of the present invention. According to the resist underlayer film, by use thereof in lithography with an electron beam or extreme ultraviolet ray, forming a fine resist pattern on the resist underlayer film is enabled. In addition, the resist underlayer film can be easily removed with a removing liquid containing an acid, or the like. The resist underlayer film can be formed, as described later, by: applying the resist underlayer film-forming composition; and heating the coating film.

Method of Producing Semiconductor Substrate

The method of producing a semiconductor substrate (hereinafter, may be also referred to as "production method") of yet other embodiment of the present invention includes: a step (hereinafter, may be also referred to as "resist underlayer film-forming composition-applying step") of applying a resist underlayer film-forming composition directly or indirectly on a substrate; a step (hereinafter, may be also referred to as "heating step") of heating a coating film formed by the resist underlayer film-forming composition-applying step; a step (hereinafter, may be also referred to as "resist film-forming composition-applying step") of applying a resist film-forming composition directly or indirectly on a resist underlayer film formed by the heating step; a step (hereinafter, may be also referred to as "exposing step") of exposing to an electron beam or extreme ultraviolet ray a resist film formed by the resist film-forming composition-applying step; and a step (hereinafter, may be also referred to as "development step") of developing the resist film exposed. In the method of producing a semiconductor substrate, the aforementioned resist underlayer film-forming composition of the one embodiment of the present invention is used as the resist underlayer film-forming composition.

The method of producing a semiconductor substrate may further include, as needed, a step (hereinafter, may be also referred to as "organic underlayer film-forming step") of forming an organic underlayer film directly or indirectly on the substrate, before the resist underlayer film-forming composition-applying step.

The method of producing a semiconductor substrate may further include, as needed, a step (hereinafter, may be also referred to as "removing step") of removing the resist underlayer film (silicon-containing film) with a removing liquid containing an acid.

In addition, the method of producing a semiconductor substrate may further include after the development step, a step (hereinafter, may be also referred to as "etching step") of carrying out etching using as a mask, a resist pattern formed or the like. By this etching step, a fine pattern is formed on the substrate per se.

According to the method of producing a semiconductor substrate, due to the resist underlayer film-forming composition of the aforementioned one embodiment being used for forming the resist underlayer film and due to carrying out exposing with an electron beam or extreme ultraviolet ray, forming a fine resist pattern on the resist underlayer film is enabled. In addition, the resist underlayer film formed is superior in removability and can be removed with a removing liquid containing an acid, or the like. Therefore, the method of producing a semiconductor substrate enables efficient production of a semiconductor substrate having a fine pattern formed thereon. It is to be noted that the "semiconductor substrate" in the production method as referred to herein means a substrate to be used in a semiconductor device (semiconductor element), and is not limited to a substrate, a material thereof being a semiconductor.

With respect to a size of the resist pattern and substrate pattern (a pattern formed on the substrate) formed in the production method, for example, a part having a line width of no greater than 100 nm, no greater than 50 nm, no greater than 30 nm, no greater than 20 nm, or no greater than 15 nm is preferably included. A minimum line width of the resist pattern formed may be, for example, 2 nm, 5 nm, or 10 nm.

Hereinafter, each step included in the method of producing a semiconductor substrate will be described.

Resist Underlayer Film-Forming Composition-Applying Step

In this step, a resist underlayer film-forming composition is applied directly or indirectly on a substrate. By this step, a coating film of the resist underlayer film-forming composition is formed directly or indirectly on the substrate. In this step, the aforementioned resist underlayer film-forming composition of the one embodiment of the present invention is used as the resist underlayer film-forming composition.

The substrate is exemplified by insulating films of silicon oxide, silicon nitride, silicon oxynitride, polysiloxane, or the like; resin substrates; and the like. Furthermore, as the substrate, a substrate having a pattern formed thereon with wiring grooves (trenches), plug grooves (vias), or the like may be used.

A procedure for applying the resist underlayer film-forming composition is not particularly limited, and for example, spin-coating or the like may be exemplified.

The case of applying the resist underlayer film-forming composition indirectly on the substrate may be exemplified by a case in which the resist underlayer film-forming composition is applied on an other film formed on the substrate, and the like. The other film formed on the substrate is exemplified by an organic underlayer film, an antireflective film, or a low-dielectric insulating film, each formed by the organic underlayer film-forming step, to be described later, and the like.

Heating Step

In this step, the coating film formed by the resist underlayer film-forming composition-applying step is heated. By thus heating, the resist underlayer film is formed through hardening of the coating film, and the like. In addition, by thus heating, amino groups are generated from the group represented by the above formula (2) in the compound (A) as described above; therefore, the resist underlayer film containing the amino groups being present on the surface thereof can be obtained.

The atmosphere in which the coating film is subjected to heating is not particularly limited, and may be, for example, an ambient air, a nitrogen atmosphere, or the like. In general, the coating film is subjected to heating in the ambient air. Various conditions such as a heating temperature and a heating time period in subjecting the coating film to heating may be predetermined appropriately. The lower limit of the heating temperature may be, for example, 150° C., and is preferably 200° C., and more preferably 210° C. or 220° C. When the heating temperature is no less than the lower limit, the amino groups can be sufficiently generated. The upper limit of the heating temperature is preferably 550° C., more preferably 450° C., and still more preferably 300° C. The lower limit of the heating time period is preferably 15 sec, and more preferably 30 sec. The upper limit of the heating time period is preferably 1,200 sec, and more preferably 600 sec.

In a case in which the resist underlayer film-forming composition contains the acid generating agent and this acid generating agent is an acid generating agent that generates an acid upon an exposure, formation of the resist underlayer film may be promoted through a combination of an exposure and heating. Alternatively, in a case in which the acid generating agent is an acid generating agent that generates an acid upon heating, the heat leads to acid generation and enables the hardening reaction to be promoted.

The lower limit of an average thickness of the resist underlayer film to be formed by this step is preferably 1 nm, more preferably 3 nm, and still more preferably 5 nm. The upper limit of the average thickness is preferably 300 nm, more preferably 100 nm, still more preferably 50 nm, and even more preferably 20 nm. It is to be noted that the average thickness of the resist underlayer film is a value measured by using a spectroscopic ellipsometer ("M2000D," available from J. A. Woollam Co.).

Resist Film-Forming Composition-Applying Step

In this step, a resist film-forming composition is applied directly or indirectly on a resist underlayer film formed by the heating. By this step, the resist film is formed directly or indirectly on the resist underlayer film.

A procedure for applying the resist film-forming composition is not particularly limited, and for example, spin-coating or the like may be exemplified.

In more detail with regard to this step, for example, the resist film is formed by: applying the resist composition such that a resultant resist film has a predetermined thickness; and thereafter subjecting the resist composition to prebaking (hereinafter, may be also referred to as "PB") to evaporate the solvent in the coating film.

A PB temperature and a PB time period of may be appropriately predetermined in accordance with the type and the like of the resist film-forming composition employed. The lower limit of the PB temperature is preferably 30° C., and more preferably 50° C. The upper limit of the PB temperature is preferably 200° C., and more preferably 150° C. The lower limit of the PB time period is preferably 10 sec, and more preferably 30 sec. The upper limit of the PB time period is preferably 600 sec, and more preferably 300 sec.

The resist film-forming composition used in this step is not particularly limited, and a well-known resist film-forming composition may be used. In general, the resist film-forming composition contains the acid generating agent (radiation-sensitive acid generating agent) that generates an acid upon an exposure to an electron beam or extreme ultraviolet ray. The resist film-forming composition is exemplified by a negative- or positive-tone resist film-forming composition containing a resin and the acid generating agent, and the like. The resin is preferably alkali-soluble. Moreover, the resin preferably has an acid-labile group.

Exposing Step

In this step, the resist film formed by the resist film-forming composition-applying step is exposed to an electron beam or extreme ultraviolet ray (wavelength: 13.5 nm or the like; "EUV"). Specifically, for example, the resist film is irradiated with an electron beam or extreme ultraviolet ray through a mask having a predetermined pattern. By this step, a difference in solubility in a developer solution is created between light-exposed regions and light-unexposed regions of the resist film. Exposure conditions may be appropriately predetermined in accordance with the type and the like of the resist film-forming composition employed.

In this step, post exposure baking (hereinafter, may be also referred to as "PEB") may be carried out after the exposure for the purpose of improving types of performance of the resist film such as a resolution, a pattern profile, and developability. A PEB temperature and a PEB time period may be appropriately predetermined in accordance with the type and the like of the resist film-forming composition employed. The lower limit of the PEB temperature is preferably 50° C., and more preferably 70° C. The upper limit of the PEB temperature is preferably 200° C., and more preferably 150° C. The lower limit of the PEB time period is preferably 10 sec, and more preferably 30 sec. The upper limit of the PEB time period is preferably 600 sec, and more preferably 300 sec.

Development Step

In this step, the resist film exposed is developed. A developer solution used in the development is exemplified by an aqueous alkali solution (alkaline developer solution), an organic solvent-containing liquid (organic solvent developer solution), and the like. For example, in the positive-tone case in which the alkaline developer solution is used, due to an increase in solubility of light-exposed regions of the resist film into the aqueous alkali solution, the light-exposed regions are removed by carrying out the development with an alkali, whereby the positive-tone resist pattern is formed. Alternatively, in the negative-tone case in which the organic solvent developer solution is used, due to a decrease in solubility of the light-exposed regions of the resist film into the organic solvent, the negative-tone resist pattern is formed by removing regions unexposed with light, which have relatively higher solubility in the organic solvent, through carrying out the development with the organic solvent.

Examples of the aqueous alkali solution (alkaline developer solution) include alkaline aqueous solutions prepared by dissolving at least one type of alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethyl ammonium hydroxide (TMAH), pyrrole, piperidine, choline, 1,8-diazabicyclo-[5.4.0]-7-undecene, and 1,5-diazabicyclo-[4.3.0]-5-nonene, and the like.

The lower limit of a proportion of the alkaline compound contained in the aqueous alkali solution is preferably 0.1% by mass, more preferably 0.5% by mass, and still more preferably 1% by mass. The upper limit of the proportion is preferably 20% by mass, more preferably 10% by mass, and still more preferably 5% by mass.

The aqueous alkali solution is preferably an aqueous TMAH solution, and more preferably a 2.38% by mass aqueous TMAH solution.

As the organic solvent contained in the organic solvent-containing liquid (organic solvent developer solution), a well-known organic solvent which may be used in the development with an organic solvent can be employed. For example, an organic solvent similar to those exemplified above as the solvent (B) in the resist film-forming composition, or the like may be employed.

The organic solvent is preferably the ester solvent, the ether solvent, the alcohol solvent, the ketone solvent and/or the hydrocarbon solvent, and more preferably the ester solvent.

The lower limit of a proportion of the organic solvent contained in the organic solvent-containing liquid is preferably 80% by mass, more preferably 90% by mass, still more preferably 95% by mass, and particularly preferably 99% by mass.

These developer solutions may be used either alone of one type, or in a combination of two or more types. It is to be noted that the development is typically followed by washing and drying.

Organic Underlayer Film-Forming Step

In this step, before the resist underlayer film-forming composition-applying step, an organic underlayer film is formed directly or indirectly on the substrate. This step is an optional step. By this step, the organic underlayer film is formed directly or indirectly on the substrate. It is to be noted that the expression "before the resist underlayer film-forming composition-applying step" as referred to herein means not only immediately before the resist underlayer film-forming composition-applying step, but means any time point upstream of the resist underlayer film-forming composition-applying step. Therefore, other optional step(s) may be included between this forming step and the resist underlayer film-forming composition-applying step.

The organic underlayer film can be formed by applying a resist underlayer film-forming composition, or the like. A procedure of forming the organic underlayer film by applying the organic underlayer film-forming composition is exemplified by a procedure of applying the organic underlayer film-forming composition directly or indirectly on the substrate to form a coating film; and hardening the coating film by subjecting the coating film to an exposure and/or heating. Examples of the organic underlayer film-forming composition include "HM8006," available from JSR Corporation, and the like. Conditions for the heating and/or the exposure may be appropriately predetermined in accordance with the type, etc., of the organic underlayer film-forming composition employed.

The case of forming the organic underlayer film indirectly on the substrate may be exemplified by a case of forming the organic underlayer film on a low-dielectric insulating film formed on the substrate, and the like.

Removing Step

In this step, the resist underlayer film is removed with a removing liquid containing an acid. This step is an optional step. By this step, the resist underlayer film is removed from the substrate. It is to be noted that this step is not limited to being carried out immediately after the forming of the resist underlayer film, but may be carried out at any time point following the forming of the resist underlayer film.

In the case in which this removing step is carried out before the resist film-forming composition-applying step, for example, the resist underlayer film can be easily removed as a rework step when defects and/or the like are detected on the resist underlayer film before the resist film-forming composition-applying step.

Also, in the case in which this removing step is carried out after the etching step, resist underlayer film residues after the etching can be removed. In the production method, there is also an advantage in that a residual film of the resist film can be removed together in this procedure.

The removing liquid containing an acid is exemplified by: a liquid containing an acid and water; a liquid obtained by mixing an acid, hydrogen peroxide, and water; and the like. Examples of the acid include sulfuric acid, hydrofluoric acid, hydrochloric acid, and the like. More specifically, the removing liquid containing an acid is exemplified by: a liquid obtained by mixing hydrofluoric acid and water; a liquid obtained by mixing sulfuric acid, hydrogen peroxide, and water; a liquid obtained by mixing hydrochloric acid, hydrogen peroxide, and water; and the like.

A procedure of removing the resist underlayer film is not particularly limited as long as the procedure enables bringing the resist underlayer film to be in contact with the removing liquid, and the procedure is exemplified by: immersing the substrate in the removing liquid; spraying the removing liquid; applying the removing liquid; and the like.

When the resist underlayer film is removed, various conditions such as a temperature and a time period are not particularly limited, and may be appropriately predetermined in accordance with a film thickness of the resist underlayer film, the type of the removing liquid used, and the like. The lower limit of the temperature of the removing liquid is preferably 20° C., and more preferably 40° C. The upper limit of the temperature is preferably 100° C., and more preferably 80° C. The lower limit of the time period is preferably 1 min and more preferably 3 min, and may be still more preferably 5 min or 10 min. The upper limit of the time period is preferably 20 min, more preferably 10 min, and still more preferably 5 min.

In this step, after the resist underlayer film is removed, washing and/or drying may be carried out.

Etching Step

In this step, etching is carried out using the resist pattern or the like as a mask. The etching may be conducted once or multiple times. In other words, the etching may be conducted sequentially with patterns obtained by the etching as masks. However, in light of obtaining a pattern having a more favorable configuration, the etching is preferably conducted multiple times. In the case in which the etching is conducted multiple times, for example, in the case of the organic underlayer film being absent, the resist underlayer film and the substrate are subjected to the etching sequentially in this order, whereas in the case of organic underlayer film being present, the resist underlayer film, the organic underlayer film, and the substrate are subjected to the etching sequentially in this order. An etching procedure may be exemplified by dry etching, wet etching, and the like. Of these, in light of the configuration of the substrate pattern to be formed being more favorable, the dry etching is preferred. As an etching gas, a fluorine-based gas, an oxygen-based gas, or the like may be appropriately selected in accordance with a material of the mask and a layer to be etched. For example, in dry etching of a resist underlayer film (silicon-containing film) conducted using a resist pattern as a mask, the fluorine-based gas is typically used, and a mixture of the fluorine-based gas with the oxygen-based gas and an inert gas may be suitably used. In dry etching of an organic underlayer film conducted using a resist underlayer film (silicon-containing film) pattern as a mask, the oxygen-based gas is typically used. In dry etching of a substrate conducted using an organic underlayer film pattern as a mask, a gas similar to that for the dry etching of the resist underlayer film (silicon-containing film), or the like may be used. After the etching, a patterned substrate having the predetermined pattern is obtained.

EXAMPLES

Hereinafter, Examples are described. It is to be noted that the following Examples merely illustrate typical Examples of the embodiments of the present invention, and the Examples should not be construed to narrow the scope of the present invention.

In the present Examples, measurement of a weight average molecular weight (Mw) of the compound (A), measurement of a concentration of the compound (A) in each solution, and measurement of an average thickness of each film were carried out by the following methods, respectively.

Measurement of Weight Average Molecular Weight (Mw)

Measurement of the weight average molecular weight (Mw) of the compound (A) was carried out by gel permeation chromatography (GPC) by using GPC columns ("G2000 HXL"×2, "G3000 HXL"×1, and "G4000 HXL"×1, all available from Tosoh Corporation) under the following conditions.

elution solvent: tetrahydrofuran
flow rate: 1.0 mL/min
sample concentration: 1.0% by mass
amount of injected sample: 100 uL
column temperature: 40° C.
detector: differential refractometer
standard substance: mono-dispersed polystyrene

Concentration of Compound (A) in Solution

The concentration (unit: % by mass) of the compound (A) in the solution was determined by: baking 0.5 g of the solution of the compound (A) at 250° C. for 30 min; measuring a mass of a residue thus obtained; and dividing the mass of the residue by the mass of the solution of the compound (A).

Average Thickness of Film

The average thickness of the film was measured by using a spectroscopic ellipsometer ("M2000D," available from J. A. Woollam Co.).

Synthesis of Compound (A)

In the following Synthesis Examples, unless otherwise specified particularly, "parts by mass" mean a value, provided that the total mass of the monomer used corresponds to 100 parts by mass.

Monomers (hereinafter, may be also referred to as "monomers (M-1) to (M-23)") used for synthesis of the compound (A) and the like are presented below.
(M-1)
$Si(OMe)_4$
(M-2)
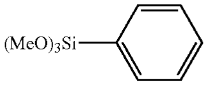
(M-3)
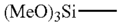
(M-4)
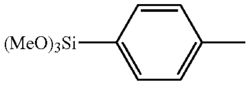
(M-5)
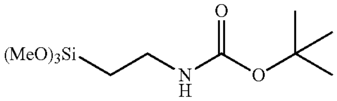
(M-6)
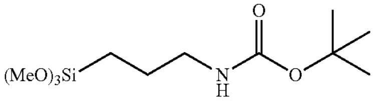
(M-7)
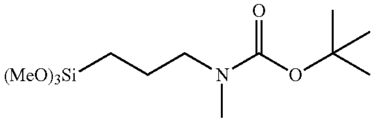
(M-8)
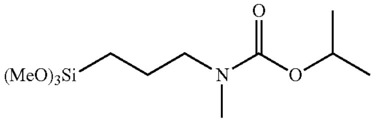
(M-9)
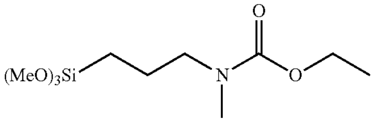
(M-10)
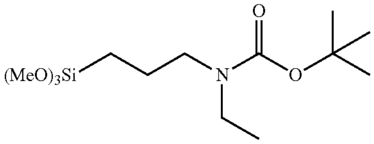
(M-11)
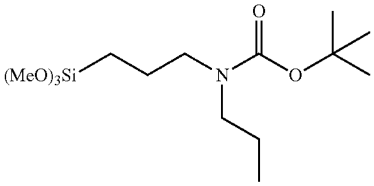
(M-12)
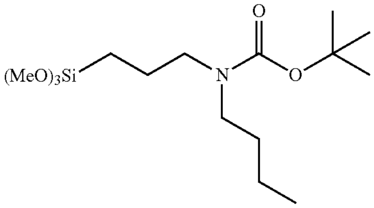
-continued
(M-13)
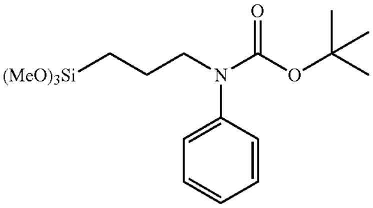
(M-14)
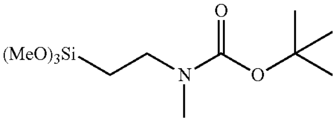
(M-15)
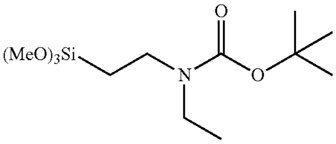
(M-16)
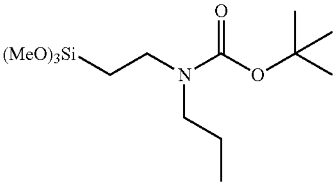
(M-17)
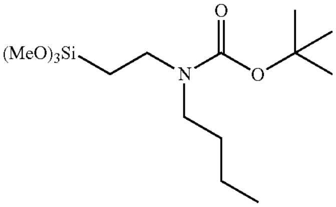
(M-18)
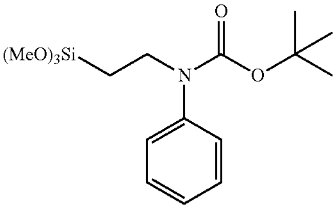
(M-19)
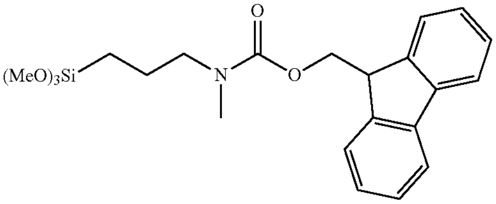
(M-20)
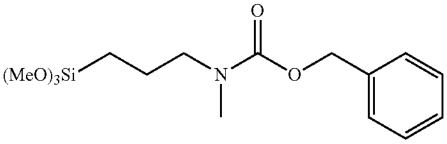

-continued (M-21)

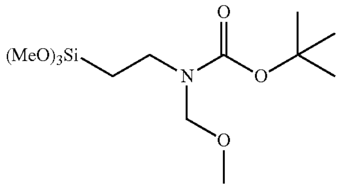

(M-22)

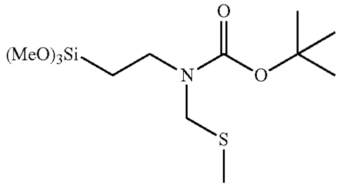

(M-23)

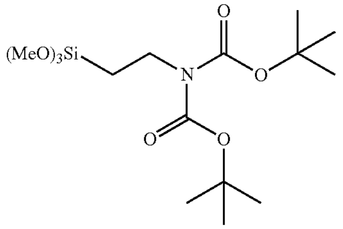

Synthesis Example 1: Synthesis of Compound (A-1)

In a reaction vessel, a monomer solution was prepared by dissolving in 91 parts by mass of propylene glycol monoethyl ether, the compound (M-1), the compound (M-4), and the compound (M-5) (100 parts by mass in total) such that the molar ratio became 83/12/5 (by mol %). The internal temperature of the reaction vessel was adjusted to 5° C., and 46 parts by mass of a 9.1% by mass aqueous oxalic acid solution were added dropwise over 20 min with stirring. After completion of the dropwise addition, the interior of the reaction vessel was heated to 40° C. and the reaction was performed for 4 hrs. After completion of the reaction, 91 parts by mass of water were added thereto and the mixture was stirred for 1 hour. After completion of the stirring, the internal temperature of the reaction vessel was lowered to no greater than 30° C. To a thus cooled reaction solution, 447 parts by mass of propylene glycol monoethyl ether were added. Thereafter, water, alcohols generated by the reaction, and excess propylene glycol monoethyl ether were removed by using an evaporator to give a propylene glycol monoethyl ether solution of the compound (A-1). The Mw of the compound (A-1) was 1,600. The concentration of the compound (A-1) in the propylene glycol monoethyl ether solution was 20.0% by mass.

Synthesis Examples 2 to 22 and Comparative Synthesis Examples 1 to 2: Synthesis of Compounds (A-2) to (A-22) and Compounds (a-1) to (a-2)

Propylene glycol monoethyl ether solutions of compounds (A-2) to (A-22) and compounds (a-1) to (a-2) were obtained in a similar manner to Synthesis Example 1 except that each monomer of the type and in the amount (mol %) shown in Table 1 below was used. The Mw of the compound (A) obtained and the concentration (% by mass) of the compound (A) in the propylene glycol monoethyl ether solution are shown together in Table 1. In Table 1, "-" indicates that the corresponding monomer was not used.

TABLE 1

| | (A) | Amount of each monomer used (mol %) | | | | | | | | | | | | | | | | | | | | | | | | Concentration of compound (A) in solution |
|---|---|---|---|---|---|---|---|---|---|---|---|---|---|---|---|---|---|---|---|---|---|---|---|---|---|---|
| | Compound | M-1 | M-2 | M-3 | M-4 | M-5 | M-6 | M-7 | M-8 | M-9 | M-10 | M-11 | M-12 | M-13 | M-14 | M-15 | M-16 | M-17 | M-18 | M-19 | M-20 | M-21 | M-22 | M-23 | Mw | (% by mass) |
| Synthesis Example 1 | A-1 | 83 | — | — | 12 | 5 | — | — | — | — | — | — | — | — | — | — | — | — | — | — | — | — | — | — | 1,600 | 20.0 |
| Synthesis Example 2 | A-2 | 83 | — | — | 12 | — | 5 | — | — | — | — | — | — | — | — | — | — | — | — | — | — | — | — | — | 1,700 | 20.0 |
| Synthesis Example 3 | A-3 | 87 | — | — | 12 | — | — | 1 | — | — | — | — | — | — | — | — | — | — | — | — | — | — | — | — | 1,500 | 20.0 |
| Synthesis Example 4 | A-4 | 85 | — | — | 12 | — | — | 3 | — | — | — | — | — | — | — | — | — | — | — | — | — | — | — | — | 1.600 | 20.0 |
| Synthesis Example 5 | A-5 | 83 | — | — | 12 | — | — | 5 | — | — | — | — | — | — | — | — | — | — | — | — | — | — | — | — | 1,900 | 20.0 |
| Synthesis .Example 6 | A-6 | 75 | — | — | 10 | — | — | 15 | — | — | — | — | — | — | — | — | — | — | — | — | — | — | — | — | 2,500 | 20.0 |
| Synthesis Example 7 | A-7 | 83 | — | — | 12 | — | — | — | 5 | — | — | — | — | — | — | — | — | — | — | — | — | — | — | — | 1,500 | 20.0 |
| Synthesis Example 8 | A-8 | 83 | — | — | 12 | — | — | — | — | 5 | — | — | — | — | — | — | — | — | — | — | — | — | — | — | 2,600 | 20.0 |
| Synthesis Example 9 | A-9 | 83 | — | — | 12 | — | — | — | — | — | 5 | — | — | — | — | — | — | — | — | — | — | — | — | — | 2,000 | 20.0 |
| Synthesis Example 10 | A-10 | 78 | — | 5 | 12 | — | — | — | — | — | — | 5 | — | — | — | — | — | — | — | — | — | — | — | — | 2,000 | 20.0 |
| Synthesis Example 11 | A-11 | 83 | — | — | 12 | — | — | — | — | — | — | — | 5 | — | — | — | — | — | — | — | — | — | — | — | 1,600 | 20.0 |
| Synthesis Example 12 | A-12 | 83 | — | — | 12 | — | — | — | — | — | — | — | — | 5 | — | — | — | — | — | — | — | — | — | — | 2,200 | 20.0 |
| Synthesis Example 13 | A-13 | 83 | — | — | 12 | — | — | — | — | — | — | — | — | — | 5 | — | — | — | — | — | — | — | — | — | 2,700 | 20.0 |

TABLE 1-continued

| | (A) | Amount of each monomer used (mol %) | | | | | | | | | | | | | | | | | | | | | | | | Concentration of compound (A) in solution |
|---|---|---|---|---|---|---|---|---|---|---|---|---|---|---|---|---|---|---|---|---|---|---|---|---|---|---|
| | Compound | M-1 | M-2 | M-3 | M-4 | M-5 | M-6 | M-7 | M-8 | M-9 | M-10 | M-11 | M-12 | M-13 | M-14 | M-15 | M-16 | M-17 | M-18 | M-19 | M-20 | M-21 | M-22 | M-23 | Mw | (% by mass) |
| Synthesis Example 14 | A-14 | 85 | 10 | — | — | — | — | — | — | — | — | — | — | — | — | 5 | — | — | — | — | — | — | — | — | 2,500 | 20.0 |
| Synthesis Example 15 | A-15 | 83 | — | — | 12 | — | — | — | — | — | — | — | — | — | — | — | 5 | — | — | — | — | — | — | — | 2,300 | 20.0 |
| Synthesis Example 16 | A-16 | 83 | — | — | 12 | — | — | — | — | — | — | — | — | — | — | — | — | 5 | — | — | — | — | — | — | 1.800 | 20.0 |
| Synthesis Example 17 | A-17 | 83 | — | — | 12 | — | — | — | — | — | — | — | — | — | — | — | — | — | 5 | — | — | — | — | — | 1,600 | 20.0 |
| Synthesis Example 18 | A-18 | 83 | — | — | 12 | — | — | — | — | — | — | — | — | — | — | — | — | — | — | 5 | — | — | — | — | 1,500 | 20.0 |
| Synthesis Example 19 | A-19 | 83 | — | — | 12 | — | — | — | — | — | — | — | — | — | — | — | — | — | — | — | 5 | — | — | — | 1,600 | 20.0 |
| Synthesis Example 20 | A-20 | 83 | — | — | 12 | — | — | — | — | — | — | — | — | — | — | — | — | — | — | — | — | 5 | — | — | 2,600 | 20.0 |
| Synthesis Example 21 | A-21 | 83 | — | — | 12 | — | — | — | — | — | — | — | — | — | — | — | — | — | — | — | — | — | 5 | — | 3,000 | 20.0 |
| Synthesis Example 22 | A-22 | 83 | — | — | 12 | — | — | — | — | — | — | — | — | — | — | — | — | — | — | — | — | — | — | 5 | 1,600 | 20.0 |
| Comparative Synthesis Example 1 | a-1 | 90 | 10 | — | — | — | — | — | — | — | — | — | — | — | — | — | — | — | — | — | — | — | — | — | 2,000 | 18.0 |
| Comparative Synthesis Example 2 | a-2 | 83 | — | 5 | 12 | — | — | — | — | — | — | — | — | — | — | — | — | — | — | — | — | — | — | — | 1,900 | 14.5 |

Preparation of Resist Underlayer Film-Forming Composition

The solvent (B) and the acid generating agent (C) used in preparing each resist underlayer film-forming composition are as shown below.

(B) Solvent

B-1: propylene glycol monomethyl ether

B-2: propylene glycol monomethyl ether acetate

(C) Acid Generating Agent

C-1: a compound represented by the following formula (C-1)

(C-1)

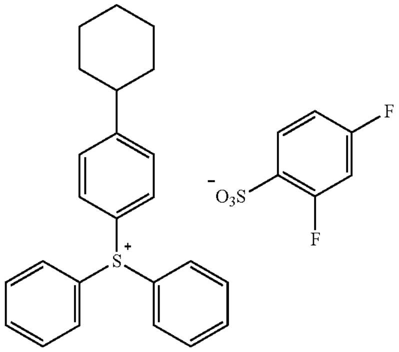

Example 1

A composition (resist underlayer film-forming composition) (J-1) was prepared by: mixing 0.5 parts by mass (not including the solvent) of (A-1) as the compound (A), and as the solvent (B), 94.5 parts by mass (including (B-1) as the solvent contained in the solution of the compound (A)) of (B-1) and 5.0 parts by mass of (B-2); and filtering a resulting solution through a PTFE (polytetrafluoroethylene) filter having a pore size of 0.2 μm.

Examples 2 to 24 and Comparative Example 1 to Comparative Example 2

Compositions (J-2) to (J-24) and (j-1) to (j-2) were prepared by a similar operation to that of Example 1 except that for each component, the type and the blended amount shown in Table 2 below were used. In Table 2, "-" indicates that the corresponding component was not used.

Preparation of Resist Composition

Each resist composition was prepared as in the following. A resist composition (R-1) was obtained by: mixing 100 parts by mass of a polymer having a structural unit (1) derived from 4-hydroxystyrene, a structural unit (2) derived from styrene, and a structural unit (3) derived from 4-t-butoxystyrene (proportion of each structural unit contained: (1)/(2)/(3)=65/5/30 (mol %)), 1.0 parts by mass of triphenylsulfonium trifluoromethanesulfonate as the radiation-sensitive acid generating agent, 4,400 parts by mass of ethyl lactate and 1,900 parts by mass of propylene glycol monomethyl ether acetate as the solvent; and filtering a resulting solution through a PTFE filter having a pore size of 0.45 μm.

Evaluations

Each composition (resist underlayer film-forming composition) prepared as described above was evaluated with regard to the resist pattern collapse-inhibiting property and film removability by the following methods. The results of the evaluations are shown in Table 2.

Resist Pattern Collapse-Inhibiting Property

A material for organic underlayer film formation ("HM8006," available from JSR Corporation) was applied on a 12-inch silicon wafer by spin-coating using a spin-coater ("CLEAN TRACK ACT 12," available from Tokyo Electron Limited), and thereafter heating was conducted at 250° C. for 60 sec to form an organic underlayer film having an average thickness of 100 nm. Each composition (resist underlayer film-forming composition) prepared as described above was applied on the organic underlayer film, and subjected to heating at 220° C. for 60 sec, followed by cooling at 23° C. for 30 sec to form a resist underlayer film having an average thickness of 10 nm. A resist composition (R-1) was applied on each resist underlayer film formed as described above, and heating was conducted at 130° C. for 60 sec, followed by cooling at 23° C. for 30 sec to form a resist film having an average thickness of 50 nm. Next, the resist film was irradiated with an extreme ultraviolet ray by varying the exposure dose using an EUV scanner ("TWINSCAN NXE: 3300B," available from ASML Co.; (NA=0.3; Sigma=0.9; quadrupole illumination, with a 1:1 line-and-space pattern mask having a line width of 25 nm in terms of a dimension on wafer). After the irradiation with the extreme ultraviolet ray, the substrate was heated at 110° C. for 60 sec, followed by cooling at 23° C. for 60 sec. Thereafter, a development was carried out using a 2.38% by mass aqueous TMAH solution (20 to 25° C.) with a puddle procedure, followed by washing with water and drying to give a substrate for evaluation having a resist pattern formed thereon. For line-width measurement and observation of the resist pattern on the substrate for evaluation, a scanning electron microscope ("CG-6300," available from Hitachi High-Technologies Corporation) was used.

The resist pattern collapse-inhibiting property was evaluated to be:

"A" (extremely favorable) in a case of resist pattern collapse of lines with a line width of 13 nm not being confirmed;

"B" (more favorable) in a case of resist pattern collapse of lines with a line width of 13 nm being confirmed, but resist pattern collapse of lines with a line width of 18 nm not being confirmed;

"C" (favorable) in a case of resist pattern collapse of lines with a line width of 18 nm being confirmed, but resist pattern collapse of lines with a line width of 22 nm not being confirmed; or "D"(unfavorable) in a case of resist pattern collapse of lines with a line width of 24 nm being confirmed

Film Removability

Each composition (resist underlayer film-forming composition) prepared as described above was applied on a 12-inch silicon wafer, and subjected to heating at 220° C. for 60 sec, followed by cooling at 23° C. for 30 sec to form a film (resist underlayer film) having an average thickness of 10 nm. Each substrate provided with a film thus obtained was immersed for 5 min in a removing liquid (aqueous mixed liquid of 96% by mass sulfuric acid/30% by mass aqueous hydrogen peroxide solution=3/1 (volume ratio)) heated to 50° C., followed by washing with water and drying to give a substrate for evaluation. In addition, each substrate provided with a film thus obtained was immersed for 10 min in a removing liquid (aqueous mixed liquid of 96% by mass sulfuric acid/30% by mass aqueous hydrogen peroxide solution=3/1 (volume ratio)) heated to 50° C., followed by washing with water and drying to give a substrate for evaluation.

A cross section of each substrate for evaluation thus obtained was observed using a field emission scanning electron microscope ("SU8220," available from Hitachi High-Technologies Corporation), and was evaluated to be:

"A" (favorable) in a case of the resist underlayer film not remaining after being immersed in the removing liquid for 5 min;

"B" (somewhat favorable) in a case of the resist underlayer film remaining after being immersed in the removing liquid for 5 min, but the resist underlayer film not remaining after being immersed in the removing liquid for 10 min; or "C" (unfavorable) in a case of the resist underlayer film remaining after being immersed in the removing liquid for 5 min and for 10 min.

TABLE 2

| | | (A) Compound | | (B) Solvent | | (C) Acid generating agent | | (D) Water | Resist | |
|---|---|---|---|---|---|---|---|---|---|---|
| | Composition | type | blended amount (parts by mass) | type | blended amount (parts by mass) | type | blended amount (parts by mass) | blended amount (parts by mass) | pattern collapse-inhibiting property | Film removability |
| Example 1 | J-1 | A-1 | 0.5 | B-1/B-2 | 94.5/5.0 | — | — | — | C | A |
| Example 2 | J-2 | A-2 | 0.5 | B-1/B-2 | 94.5/5.0 | — | — | — | C | A |
| Example 3 | J-3 | A-3 | 0.5 | B-1/B-2 | 94.5/5.0 | — | — | — | B | B |
| Example 4 | J-4 | A-4 | 0.5 | B-1/B-2 | 94.5/5.0 | — | — | — | A | A |
| Example 5 | J-5 | A-5 | 0.5 | B-1/B-2 | 94.5/5.0 | — | — | — | A | A |
| Example 6 | J-6 | A-6 | 0.5 | B-1/B-2 | 94.5/5.0 | — | — | — | A | A |
| Example 7 | J-7 | A-7 | 0.5 | B-1/B-2 | 94.5/5.0 | — | — | — | B | A |
| Example 8 | J-8 | A-8 | 0.5 | B-1/B-2 | 94.5/5.0 | — | — | — | B | A |
| Example 9 | J-9 | A-9 | 0.5 | B-1/B-2 | 94.5/5.0 | — | — | — | A | A |
| Example 10 | J-10 | A-10 | 0.5 | B-1/B-2 | 94.5/5.0 | — | — | — | A | A |
| Example 11 | J-11 | A-11 | 0.5 | B-1/B-2 | 94.5/5.0 | — | — | — | A | A |

TABLE 2-continued

| | (A) Compound | | (B) Solvent | | (C) Acid generating agent | | (D) Water | Resist | |
|---|---|---|---|---|---|---|---|---|---|
| Composition | type | blended amount (parts by mass) | type | blended amount (parts by mass) | type | blended amount (parts by mass) | blended amount (parts by mass) | pattern collapse-inhibiting property | Film removability |
| Example 12 | J-12 | A-12 | 0.5 | B-1/B-2 | 94.5/5.0 | — | — | — | A | A |
| Example 13 | J-13 | A-13 | 0.5 | B-1/B-2 | 94.5/5.0 | — | — | — | A | A |
| Example 14 | J-14 | A -14 | 0.5 | B-1/B-2 | 94.5/5.0 | — | — | — | A | A |
| Example 15 | J-15 | A-15 | 0.5 | B-1/B-2 | 94.5/5.0 | — | — | — | A | A |
| Example 16 | J-16 | A-16 | 0.5 | B-1/B-2 | 94.5/5.0 | — | — | — | A | A |
| Example 17 | J-17 | A-17 | 0.5 | B-1/B-2 | 94.5/5.0 | — | — | — | A | A |
| Example 18 | J-18 | A-18 | 0.5 | B-1/B-2 | 94.5/5.0 | — | — | — | B | B |
| Example 19 | J-19 | A-19 | 0.5 | B-1/B-2 | 94.5/5.0 | — | — | — | B | B |
| Example 20 | J-20 | A-20 | 0.5 | B-1/B-2 | 94.5/5.0 | — | — | — | A | A |
| Example 21 | J-21 | A-21 | 0.5 | B-1/B-2 | 94.5/5.0 | — | — | — | A | A |
| Example 22 | J-22 | A-22 | 0.5 | B-1/B-2 | 94.5/5.0 | — | — | — | A | A |
| Example 23 | J-23 | A-5 | 0.5 | B-1/B-2 | 93.95/5.0 | C-1 | 0.05 | 0.5 | A | A |
| Example 24 | J-24 | A-9 | 0.5 | B-1/B-2 | 93.95/5.0 | C-1 | 0.05 | 0.5 | A | A |
| Comparative Example 1 | j-1 | a-1 | 0.5 | B-1/B-2 | 94.5/5.0 | — | — | — | D | C |
| Comparative Example 2 | j-2 | a-2 | 0.5 | B-1/B-2 | 94.5/5.0 | — | — | — | D | C |

As is clear from the results shown in the above Table 2, each of the compositions of the Examples (resist underlayer film-forming compositions) was favorable in terms of the resist pattern collapse-inhibiting property, and forming a fine resist pattern on the resist underlayer film was enabled. Furthermore, the resist underlayer film formed from each of the compositions of the Examples was favorable in terms of film removability.

The resist underlayer film-forming composition to be used in lithography with an electron beam or extreme ultraviolet ray of the embodiment of the present invention can be suitably used in manufacturing a semiconductor substrate, and the like.

Obviously, numerous modifications and variations of the present invention are possible in light of the above teachings. It is therefore to be understood that within the scope of the appended claims, the invention may be practiced otherwise than as specifically described herein.

What is claimed is:

1. A resist underlayer film-forming composition comprising:

a polysiloxane compound comprising a first structural unit represented by formula (1); and a solvent, (1)

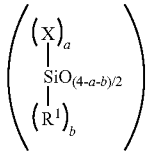

wherein, in the formula (1), X represents a group represented by formula (2); a is an integer of 1 to 3, wherein in a case in which a is no less than 2, a plurality of Xs are identical or different from each other; $R^1$ represents a halogen atom, a hydroxy group, or a monovalent organic group having 1 to 20 carbon atoms; and b is an integer of 0 to 2, wherein in a case in which b is 2, two $R^1$s are identical or different from each other, and wherein a sum of a and b is no greater than 3, and (2)

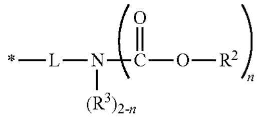

wherein, in the formula (2), $R^2$ represents a monovalent hydrocarbon group having 1 to 20 carbon atoms; n is 1 or 2, wherein in a case in which n is 2, a plurality of $R^2$s are identical or different from each other; $R^3$ represents a monovalent organic group having 1 to 20 carbon atoms; L represents a single bond or a divalent linking group; and * denotes a site bonding to the silicon atom in the formula (1), wherein the resist underlayer film-forming composition is suitable for lithography with an electron beam or extreme ultraviolet ray.

2. The resist underlayer film-forming composition according to claim 1, wherein $R^2$ in the formula (2) represents a monovalent chain hydrocarbon group having 1 to 20 carbon atoms or a monovalent aromatic hydrocarbon group having 6 to 20 carbon atoms.

3. The resist underlayer film-forming composition according to claim 2, wherein the monovalent chain hydrocarbon group which is represented by $R^2$ in the formula (2) has a tertiary carbon atom, and the monovalent chain hydrocarbon group bonds to the oxygen atom at the tertiary carbon atom.

4. The resist underlayer film-forming composition according to claim 1, wherein n in the formula (2) is 1.

5. The resist underlayer film-forming composition according to claim 1, wherein the monovalent organic group represented by $R^3$ in the formula (2) is a monovalent hydrocarbon group having 1 to 20 carbon atoms.

6. The resist underlayer film-forming composition according to claim 1, wherein the linking group which is represented by L in the formula (2) is a divalent chain hydrocarbon group having 1 to 20 carbon atoms.

7. The resist underlayer film-forming composition according to claim 1, wherein the polysiloxane compound further comprises a second structural unit represented by formula (3):

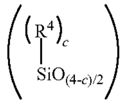

(3)

wherein, in the formula (3), $R^4$ represents a halogen atom, a hydroxy group, or a monovalent organic group having 1 to 20 carbon atoms; c is an integer of 1 to 3, wherein in a case in which c is no less than 2, a plurality of $R^4$s are identical or different from each other.

8. The resist underlayer film-forming composition according to claim 1, wherein the polysiloxane compound further comprises a third structural unit represented by formula (4):

$$(SiO_{4/2}) \quad (4)$$

9. A resist underlayer film, which is formed from the resist underlayer film-forming composition according to claim 1.

10. A method of producing a semiconductor substrate, the method comprising:

applying a resist underlayer film-forming composition directly or indirectly on a substrate to form a coating film;

heating the coating film to form a resist underlayer film;

applying a resist film-forming composition directly or indirectly on the resist underlayer film to form a resist film;

exposing the resist film to an electron beam or extreme ultraviolet ray; and developing the resist film exposed, wherein the resist underlayer film-forming composition comprises:

a polysiloxane compound comprising a first structural unit represented by formula (1); and a solvent,

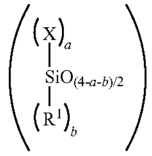

(1)

wherein, in the formula (1), X represents a group represented by formula (2); a is an integer of 1 to 3, wherein in a case in which a is no less than 2, a plurality of Xs are identical or different from each other; $R^1$ represents a halogen atom, a hydroxy group, or a monovalent organic group having 1 to 20 carbon atoms; and b is an integer of 0 to 2, wherein in a case in which b is 2, two $R^1$s are identical or different from each other, and wherein a sum of a and b is no greater than 3, and

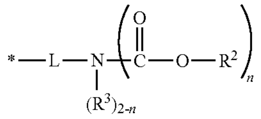

(2)

wherein, in the formula (2), $R^2$ represents a monovalent hydrocarbon group having 1 to 20 carbon atoms; n is 1 or 2, wherein in a case in which n is 2, a plurality of $R^2$s are identical or different from each other; $R^3$ represents a monovalent organic group having 1 to 20 carbon atoms; L represents a single bond or a divalent linking group; and * denotes a site bonding to the silicon atom in the formula (1).

11. The method according to claim 10, wherein a heating temperature in the heating of the coating film is no less than 200° C.

12. The method according to claim 10, further comprising before the applying of the resist underlayer film-forming composition, forming an organic underlayer film directly or indirectly on the substrate.

13. The method according to claim 10, further comprising removing the resist underlayer film with a removing liquid comprising an acid.

* * * * *